United States Patent
Karpov et al.

(10) Patent No.: US 9,548,449 B2
(45) Date of Patent: Jan. 17, 2017

(54) CONDUCTIVE OXIDE RANDOM ACCESS MEMORY (CORAM) CELL AND METHOD OF FABRICATING SAME

(71) Applicants: Elijah V. Karpov, Santa Clara, CA (US); Brian S. Doyle, Portland, OR (US); Uday Shah, Portland, OR (US); Robert S. Chau, Portland, OR (US)

(72) Inventors: Elijah V. Karpov, Santa Clara, CA (US); Brian S. Doyle, Portland, OR (US); Uday Shah, Portland, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 222 days.

(21) Appl. No.: 13/925,951

(22) Filed: Jun. 25, 2013

(65) Prior Publication Data
US 2014/0374689 A1 Dec. 25, 2014

(51) Int. Cl.
*H01L 45/00* (2006.01)
*H01L 27/24* (2006.01)

(52) U.S. Cl.
CPC ......... *H01L 45/146* (2013.01); *H01L 27/2436* (2013.01); *H01L 27/2463* (2013.01); *H01L 45/08* (2013.01); *H01L 45/1233* (2013.01); *H01L 45/1266* (2013.01)

(58) Field of Classification Search
CPC .. H01L 45/08; H01L 45/1233; H01L 45/1266; H01L 45/146; H01L 45/147; H01L 27/2436; H01L 27/2463
See application file for complete search history.

(56) References Cited

U.S. PATENT DOCUMENTS

| | | | |
|---|---|---|---|
| 6,586,761 B2* | 7/2003 | Lowrey | H01L 27/2463 257/2 |
| 2007/0200158 A1* | 8/2007 | Genrikh et al. | 257/306 |
| 2009/0014770 A1* | 1/2009 | Terao et al. | 257/314 |
| 2009/0317958 A1* | 12/2009 | Tang et al. | 438/384 |
| 2009/0323397 A1* | 12/2009 | Kinoshita | 365/148 |
| 2011/0049460 A1 | 3/2011 | Breitwisch et al. | |

(Continued)

FOREIGN PATENT DOCUMENTS

JP 2004342843 12/2004

OTHER PUBLICATIONS

Guziewicz et al., "Electrical and optical properties of NiO films deposited by magnetron sputtering", Optica Applicata, vol. 41, No. 2, pp. 431-440, 2011.*

(Continued)

*Primary Examiner* — Anthony Ho
*Assistant Examiner* — Victor Barzykin
(74) *Attorney, Agent, or Firm* — Blakely, Sokoloff, Taylor & Zafman LLP (57) ABSTRACT

Conductive oxide random access memory (CORAM) cells and methods of fabricating CORAM cells are described. For example, a material layer stack for a memory element includes a first conductive electrode. An insulating layer is disposed on the first conductive oxide and has an opening with sidewalls therein that exposes a portion of the first conductive electrode. A conductive oxide layer is disposed in the opening, on the first conductive electrode and along the sidewalls of the opening. A second electrode is disposed in the opening, on the conductive oxide layer.

18 Claims, 9 Drawing Sheets

(56) References Cited

U.S. PATENT DOCUMENTS

| | | |
|---|---|---|
| 2012/0074375 A1 | 3/2012 | Shimakawa et al. |
| 2012/0104353 A1* | 5/2012 | Lee et al. .......................... 257/5 |
| 2012/0286231 A1 | 11/2012 | Saito et al. |
| 2013/0075686 A1 | 3/2013 | Kawasaki |
| 2013/0112935 A1 | 5/2013 | Himeno et al. |

OTHER PUBLICATIONS

Office Action and Search Report from Taiwanese Patent Application No. 103121021 mailed Jun. 24, 2015, 16 pgs.

International Search Report and Written Opinion from PCT/US2014/043156 mailed Oct. 21, 2014, 13 pgs.

International Preliminary Report on Patentability from PCT/US2014/043156 mailed Jan. 7, 2015, 10 pgs.

\* cited by examiner

CROSS-SECTIONAL VIEW    TOP PLAN VIEW

CONDUCTIVE OXIDE RANDOM ACCESS MEMORY (CORAM) CELL AND METHOD OF FABRICATING SAME

TECHNICAL FIELD

Embodiments of the invention are in the field of memory devices and, in particular, conductive oxide random access memory (CORAM) cells and methods of fabricating CORAM cells.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change, known as RRAM/ReRAM, typically operates at voltages greater than 1V, typically requires a high voltage (>1V) forming step to form a filament. For low voltage non-volatile embedded applications, operating voltages less than 1V and compatible with CMOS logic processes may be desirable.

Thus, significant improvements are still needed in the area of nonvolatile memory device manufacture and operation.

DESCRIPTION OF THE EMBODIMENTS

Conductive oxide random access memory (CORAM) cells and methods of fabricating CORAM cells are described. In the following description, numerous specific details are set forth, such as specific conductive oxide material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of described herein are directed to low voltage embedded memory having conductive oxide and electrode stacks. Such embedded memory designs may have applications for logic and/or system-on-chip (SoC) semiconductor products.

To provide context, nonvolatile memory based on resistance change, known as RRAM/ReRAM, initializes and operates at V>1V. For low voltage non-volatile embedded applications, however, operating voltages of less than 1V may be need for compatibility with CMOS logic processes. In an embodiment, a metal-conductive oxide-metal (MCOM) structure is implemented to fabricate a resistance change memory based architecture, e.g., instead of a metal-dielectric (insulating) oxide-metal (MIM) based structure. The latter type is conventionally used for state of the art RRAM devices. For example, a conventional RRAM device may be based on a metal-$HfO_x$-metal structure.

Figure 1:
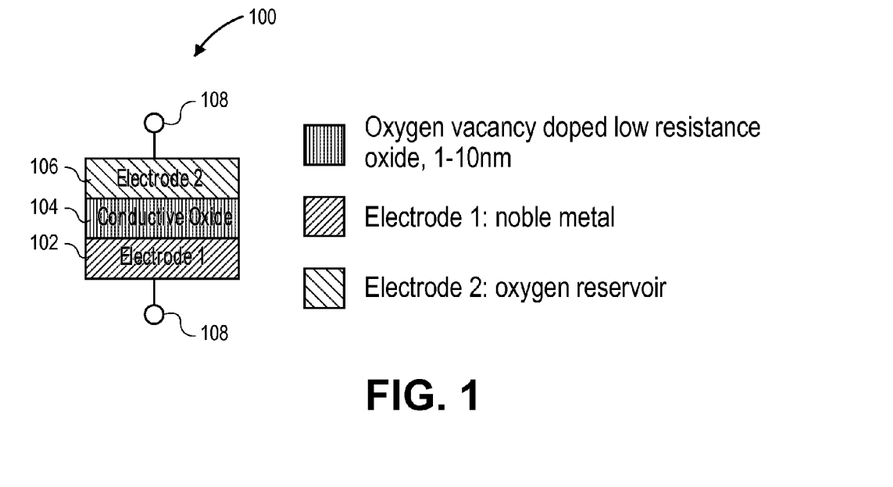
FIG. 1 illustrates a metal-conductive oxide-metal (MCOM) memory element, in accordance with an embodiment of the present invention.

To illustrate concepts described herein, FIG. 1 illustrates a metal-conductive oxide-metal (MCOM) memory element, in accordance with an embodiment of the present invention. Referring to FIG. 1, a memory element 100 includes a first electrode 102, a conductive oxide layer 104, and a second electrode 106. The memory element 100 may be included in a memory architecture via nodes 108. For example, such a device may be placed between a bitline and a selector element such as a 1T (MOS transistor), or 2-terminal thin film selector which is connected to a wordline. In a particular embodiment, as indicated by the reference scheme in FIG. 1 to the right of memory element 100, the conductive oxide layer 104 is a conductive oxide having a thickness approximately in the range of 2-15 nanometers, the first electrode 102 is composed of a noble metal, and the second electrode 106 is the same or dissimilar electrode with high work function (WF) greater than approximately 4.2 eV.

Figure 2:
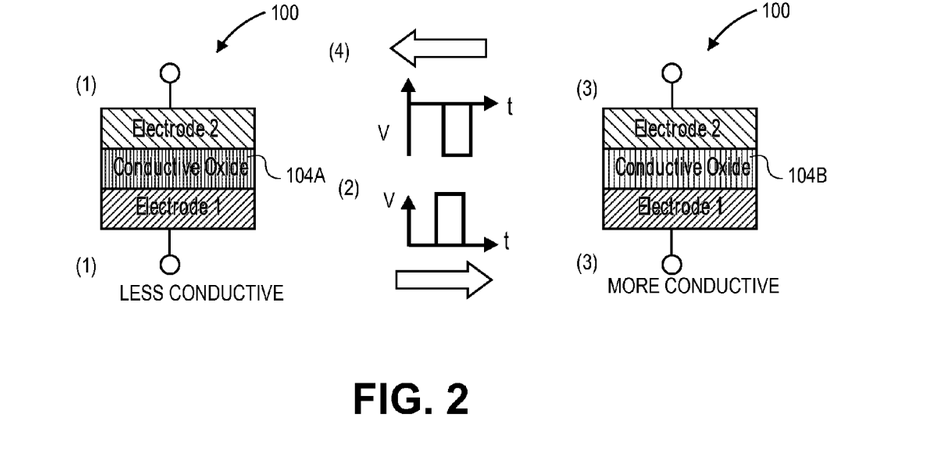
FIG. 2 illustrates an operational schematic representing a changing of states ("0" and "1") for the memory element of FIG. 1, in accordance with an embodiment of the present invention.

FIG. 2 illustrates an operational schematic representing a changing of states for the memory element of FIG. 1, in accordance with an embodiment of the present invention. Referring to FIG. 2, memory element 100 may begin in a less conductive state (1), with conductive oxide layer 104 being in a less conductive state 104A. An electrical pulse, such as a duration of a positive bias (2) may be applied to provide memory element 100 in a more conductive state (3), with conductive oxide layer 104 being in a more conductive state 104B. An electrical pulse, such as a duration of a negative bias (4) may be applied to again provide memory element 100 having the less conductive state (1). Thus, electrical pulsing may be used to change resistance of the memory element 100. Furthermore, the transition is a reversible transition in that the memory film is conductive and resistivity is modulated by the pulsing of low voltage of opposite polarity. The actual reversible change can be faster than 100 nanoseconds.

Figure 3:
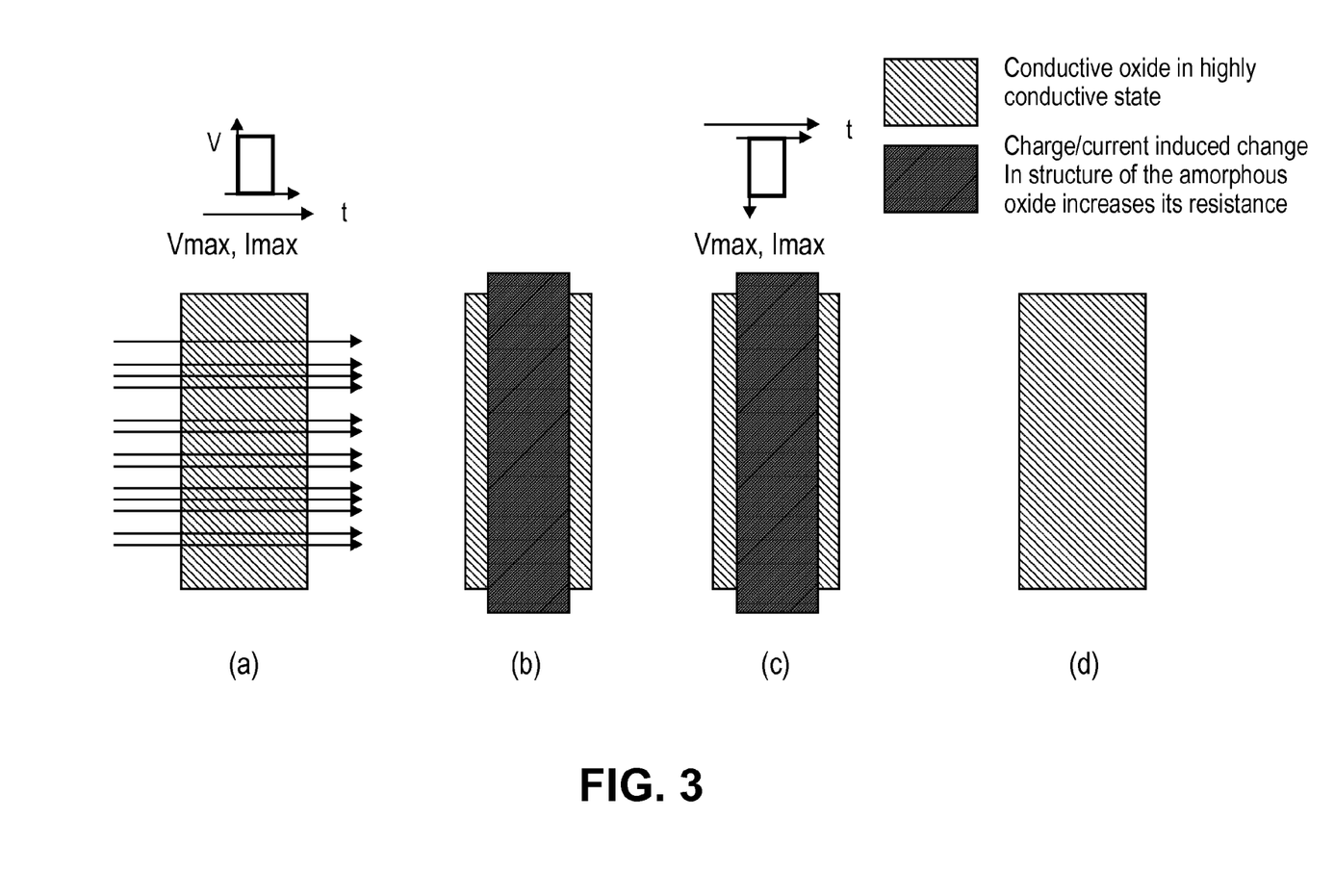
FIG. 3 illustrates operation of a device having an MCOM element, in accordance with an embodiment of the present invention.

FIG. 3 is a schematic illustration of resistance change in an amorphous oxide, where (a) illustrates that current/charge passing through a conductive oxide in its low resistance state (LRS) results in the change of configuration state of the amorphous oxide. The change blocks the current conduction and resistance of the device increases to a high resistance state (b), where the oxide does not conduct current as well as in (a). When opposite polarity voltage is applied to the device the electric field across the conductive oxide in high resistance state (c) restores the original configuration state of the conductive oxide (d).

Thus, in an embodiment, a memory element includes a conductive oxide layer sandwiched between two electrodes. In one such embodiment, the memory element includes a thin film of conductive oxide sandwiched between two conductive electrodes having high a work function, e.g., greater than approximately 4.2 eV. Resistivity of the conductive oxide layer in low field (when device is read) is, in some embodiments, can be as low as typically found for of conductive films of metal compounds, e.g. TiAlN. For example, in a specific embodiment, the resistivity for such a layer is approximately in the range of 0.1 Ohm cm-10 kOhm cm when measured at low field. Resistivity of the film is tuned depending in the memory element size to achieve final resistance value in the range compatible with faster read. Resistance change is induced, in some embodiments, by Mott transition, charge induced metal insulator transitions, or more generally by changes in the structural configuration of amorphous oxides caused by application of electrical field and/or current.

Figure 4:
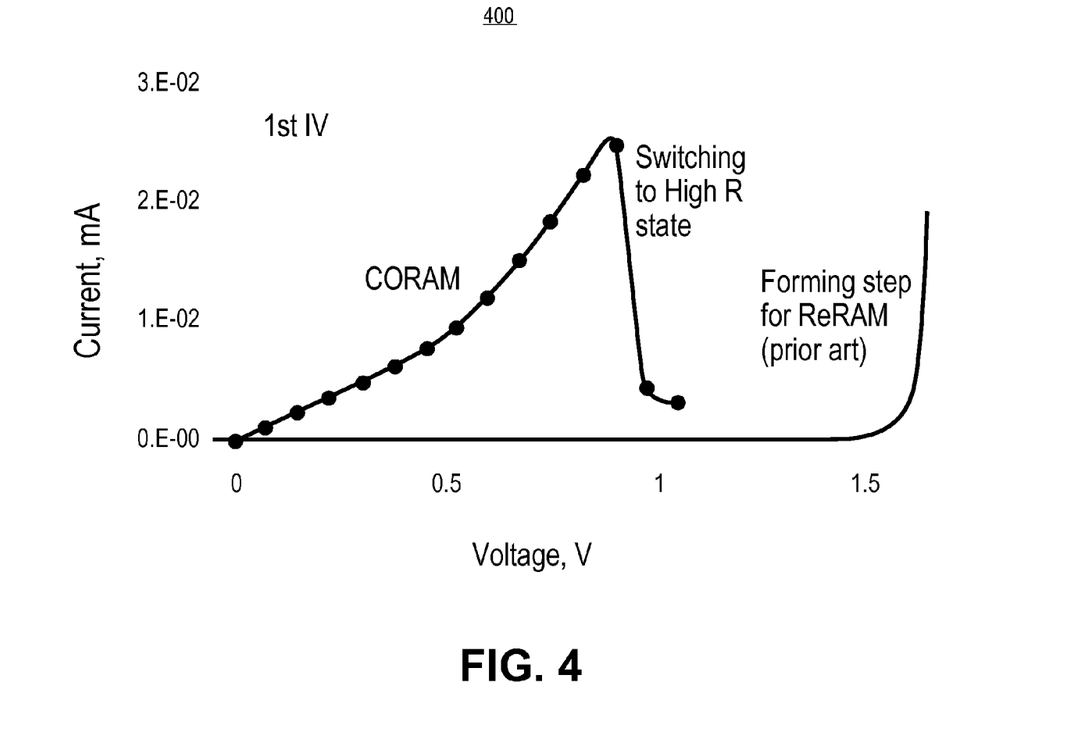
FIG. 4 is a plot of current (in mA) as a function of voltage (in V) for a conductive oxide random access memory (CORAM) element versus that for a conventional ReRAM, in accordance with an embodiment of the present invention.

In an aspect, memory elements described herein operate at less than approximately 1V. For example, FIG. 4 is a plot 400 of current (in mA) as a function of voltage (in V) for a conductive oxide random access memory (CORAM) element versus that for a conventional ReRAM, in accordance with an embodiment of the present invention. Referring to plot 400, the upper curve of the CORAM element shows good conductivity for a just fabricated device up until approximately 1V at which point the element switches to a resistive state. This is contrasted against the lower curve which demonstrates a forming step for a prior art ReRAM element. In the former CORAM case, in one embodiment, in order to avoid too high resistance state, the switching is performed at less than 1V. The memory cell starts operation in low resistance state and exhibits N-shape NDR at 1V.

Figure 5:
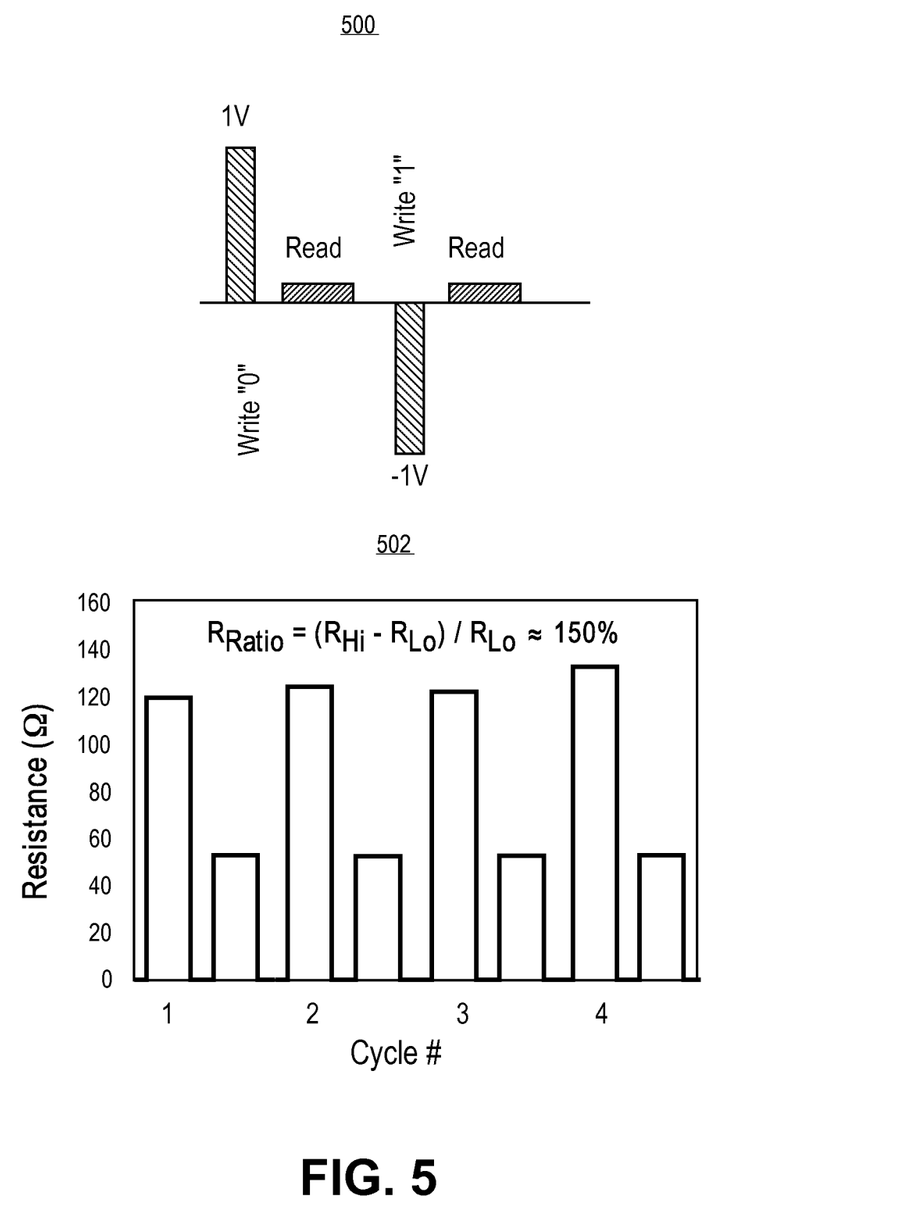
FIG. 5 includes a plot demonstrating write "0" and write "1" voltage pulses along with a corresponding plot of final device resistance (in Ohms), corresponding to memory states "1" and "0", as a function of cycle numbers, in accordance with an embodiment of the present invention.

FIG. 5 includes a plot 500 demonstrating write "0" and write "1" voltage pulses along with a corresponding plot 502 of resistance (in Ohms) as a function of cycle numbers, in accordance with an embodiment of the present invention. Referring to plots 500 and 502, writing 0s and 1s performed with 1 V pulses and, accordingly, cell resistance is changed by alternating +/−1V pulses.

In accordance with an embodiment of the present invention, and as is applicable throughout, a CORAM element includes conductive oxide memory layer having a thickness approximately in the range of 2-15 nanometers. In another embodiment, conductive oxide memory layer is composed of a material such as solid solution of transition metal oxides or binary oxides in which one of the metals can form oxides of different valencies. One of the oxides in the solid solution can be thought as a matrix while the other one as a dopant. In another embodiment valencies of metals in solid solution can be different by 1. In accordance with an embodiment of the present invention low resistivity oxide can be oxygen deficient sub-stoichiometric oxide. In accordance with an embodiment of the present invention, the memory layer of the CORAM element is amorphous, e.g., an amorphous oxide. In one such embodiment, the amorphous oxide is composed of a solid solution of transition metal oxides or binary oxides in which one of the metals can form oxides of different valencies or differ in valency from the other metal by 1. In an embodiment, the electrode material need not be dissimilar.

As exemplified above, in an embodiment, one electrode in a memory element including a conductive oxide layer is a noble metal based electrode. In an embodiment, examples of suitable noble metals include, but are not limited to Pd or Pt. More generally, in an embodiment, the electrode is one of V, Cr, W, Pd, Ir or Pt, which may be preferable over Hf, Mn, Zr, or Ta.

In other embodiments, one or both of the electrodes is fabricated from a second, different conductive oxide material, i.e. different from the switchable conductive oxide layer. In an embodiment, examples of suitable conductive oxides for an electrode layer include, but are not limited to: ITO ($In_2O_{3-x}SnO_{2-x}$). In other embodiments, an electrode is fabricated from a similar conductive oxide material as the switchable layer. It is to be understood that, in either case, for embodiments using a conductive oxide material for an electrode layer, the change of resistance of such electrode during programming can contribute to the total resistance change.

In an aspect, a CORAM element is fabricated in a damascene-like fabrication scheme. As an example, FIGS. 6A-6E illustrate cross-sectional views representing various operations in a method of fabricating a CORAM element, in accordance with an embodiment of the present invention.

Figure 6A:
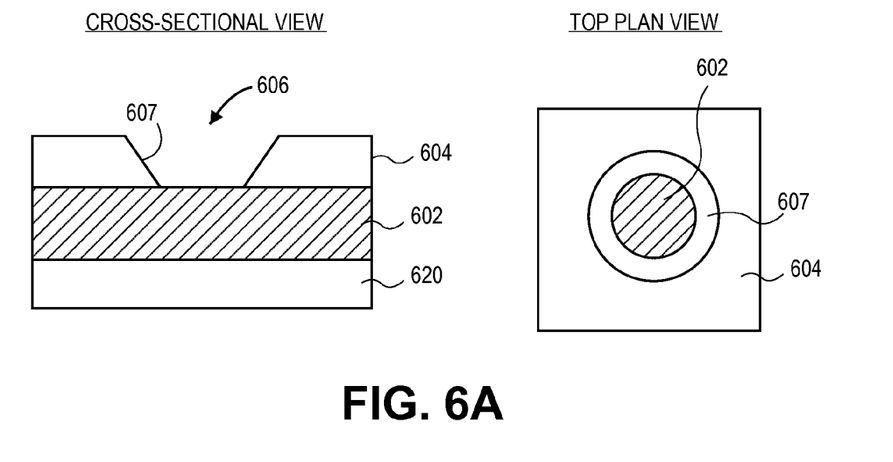
FIGS. 6A-6E illustrate cross-sectional views representing various operations in a method of fabricating a CORAM element, in accordance with an embodiment of the present invention.

Referring to FIG. 6A, a bottom electrode 602 of a CORAM element is provided having a patterned isolation layer 604 thereon. The isolation layer has an opening 606 with sloped sidewalls 607 formed therein. In one embodiment, the sidewalls are sloped as much as approximately 50 degrees from normal of the surface of the bottom electrode 602. A plan view perspective is also provided for the stack shown in FIG. 6A. Additionally, in an embodiment, the bottom electrode 602 is shown as disposed above a metal line or via 620. The metal line or via 620 may be a copper feature such as a back end of line (BEOL) M2 line or M3 line or a via. In one such embodiment, the bottom electrode 602 is formed above a bitline or, alternatively, a wordline.

Figure 6B:
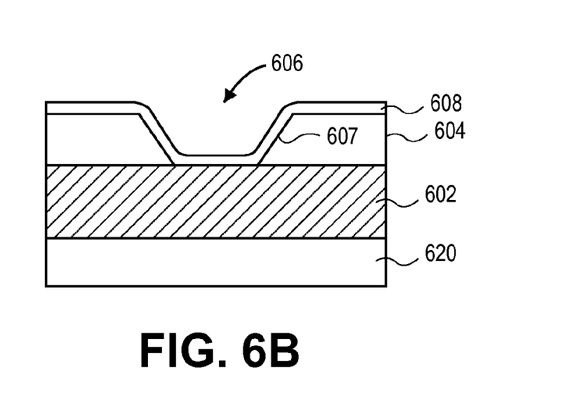
Figure 6C:
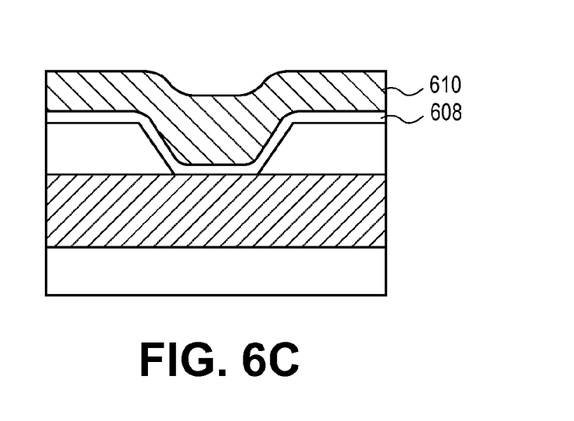
Figure 6D:
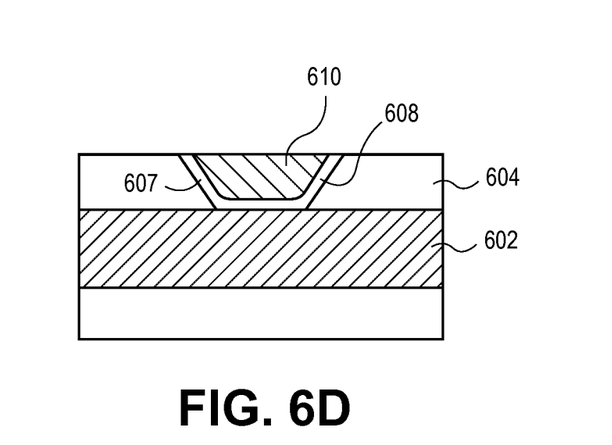
Figure 6E:
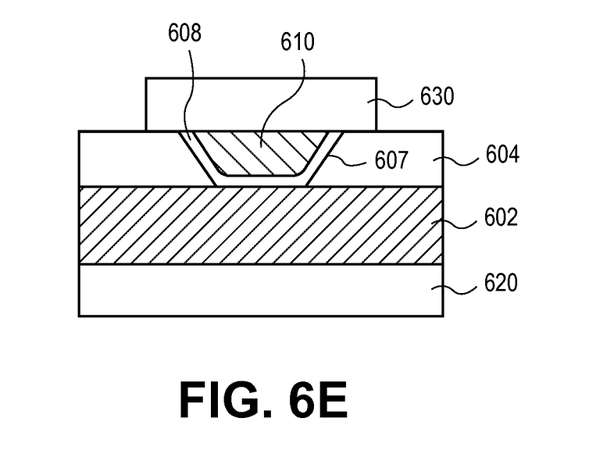

Referring to FIG. 6B, CORAM memory layer 608 (e.g., a conductive metal oxide layer) is formed on the structure of FIG. 6A. In one such embodiment, the CORAM memory layer 608 is amorphous and is formed conformal with the tapered or sloped sidewalls 607 of the opening 606. In an embodiment, use of a large slope avoids cusping of the CORAM memory layer 608 within the opening 606. Accordingly, a CORAM device can be fabricated in a contact area by deposing an amorphous oxide film that has topography. As illustrated in FIGS. 6C-6E, the resulting device includes a memory layer that is concave and is fabricated with no sidewall etch.

Referring to FIG. 6C, material of a top electrode 610 is formed by deposition on the CORAM memory layer 608.

The material of a top electrode 610 and the CORAM memory layer 608 are then planarized, e.g., by a chemical mechanical planarization or polishing (CMP) process. The planarizing confines the CORAM memory layer 608 and the tope electrode 610 to the opening in the patterned isolation layer 604, as depicted in FIG. 6D. Referring to FIG. 6E, in an embodiment, an upper conductive line 630, such as a wordline or, alternatively, a bitline, is formed above the upper electrode 610. In one such embodiment, the resulting metal line or via 620, bottom electrode 602, CORAM memory layer 608, top electrode 610 and conductive line 630 are used to form a cross-point in a cross-point memory array.

Referring again to FIG. 6A, in an embodiment, isolation layer 604 is composed of an oxide or nitride insulator layer. In one such embodiment, opening 606 is formed by an etch process selective to the underlying bottom electrode 602 material. In a specific such embodiment, opening 606 is formed using an etch process based on $C_xF_y$, or $C_xH_yF_z/Ar/O_2$ chemistry for selectivity to the bottom electrode 602. It is noted that while $O_2$ may be desirable for selectivity to metal, $O_2$ may cause a present resist layer to erode and, thus, the etch may be performed oxygen-free or with very little $O_2$. By contrast to the above described etching of the isolation layer 604, as described above, the CORAM memory layer and top electrode material are polished (e.g., by using a chemical mechanical planarization (CMP) process) and are not etched.

Overall, referring again to the FIGS. 6A-6E, fabrication of top and bottom electrodes of a CORAM element involves isolation between formed layers by a thick (e.g., about 50 nanometer) isolation dielectric. As such the above described process can be robust against shorting. Also, in an embodiment, a memory element including a conductive oxide layer is fabricated by a process flow including a capacitor flow for which CORAM and top electrode are deposited in situ to eliminate contamination related effects. Memory operation of the resulting CORAM element can be performed at voltages at or below DC 1V. In one embodiment, the fabricated device does not require application of initial high voltage DC sweep, e.g., as is known as first fire for conventional devices.

In another aspect, a CORAM element may be included in an integrated circuit in regions typically referred to as back end or back end of line (BEOL) layers of the integrated circuit. As examples, FIG. 7 illustrates schematic views of several options for positioning a CORAM element in an integrated circuit, in accordance with an embodiment of the present invention.

Figure 7:
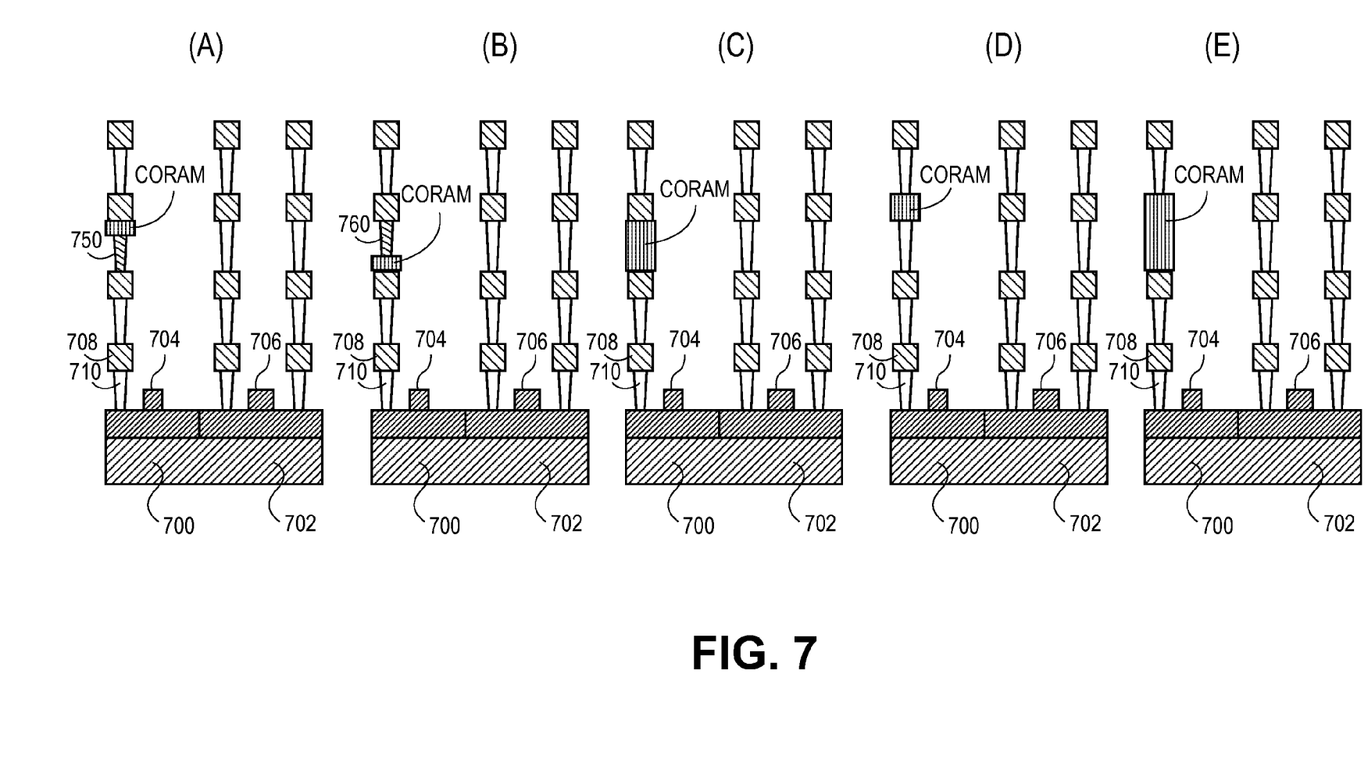
FIG. 7 illustrates schematic views of several options for positioning a CORAM element in an integrated circuit, in accordance with an embodiment of the present invention.

Referring to FIG. 7, five examples (A)-(E) of a CORAM cell situated above a second metal logic layer (M2) or higher are provided. In each case, a memory region 700 and a logic region 702 of an integrated circuit are depicted schematically. Each memory region 700 and logic region 702 is associated with a corresponding transistor (or group of transistors) 704 or 706, respectively. Stacks of metallization layers (shown without encompassing dielectric layers) includes metal lines 708 and vias 710 that are generally alternating. Thus, all arrangements depicted include a CORAM element disposed above a second metal line (M2) in the stack. The CORAM element typically includes a conductive oxide memory layer sandwiched between a bottom electrode and a top electrode, and may be formed in an opening of an insulating layer, examples of which are described above. The described arrangements can enable integration of both logic and memory on a same die versus stand-alone memory.

Referring again to FIG. 7, in a first example (A), a CORAM element is fabricated on top of a unique via 750 intended for memory devices. In a second example (B), a CORAM element is fabricated first and an upper unique via 760 contacts the CORAM from above. In a third example (C), a CORAM element has a top electrode with an increased thickness such that the CORAM element occupies a full via depth, between metal lines. In a fourth example (D), a CORAM element has a top electrode with an increased thickness such that the CORAM element occupies a full metal line height. In a fifth example (E), a CORAM element has a top electrode with an increased thickness such that the CORAM element occupies a full interconnect level (via plus metal line).

One of the differences of one or more embodiments described herein with respect to state of the art resistive devices is that all layers in the stack of the memory element are composed of conducting thin films. As a result, the device structure for the resulting resistive memory element is different from the state of the art devices where at least one of the films is an insulator and/or dielectric film. For such films in the conventional devices in the as fabricated state, the resistivity is many orders of magnitude higher than that of metal compounds and is essentially non measurable at low field until the device is formed. However, in embodiments described herein, since all layers in the memory element are conductors, the arrangement enables one or more of the following: (1) low voltage operation, e.g., less than 1 Volt operation; (2) elimination of the need for a one time high voltage, commonly called forming voltage, required for state of the art RRAM; and (3) low resistances (e.g., since all components are conductors) which can provide for fast read in operation of a memory device having the MCOM structure.

Referring again to the description associated with FIGS. 1-7 above, a stack of conductive layers including a conductive metal oxide layer may be used to fabricate as memory bit cell. For example, FIG. 8 illustrates a schematic of a memory bit cell 800 which includes a metal-conductive oxide-metal (MCOM) memory element 810, in accordance with an embodiment of the present invention.

Figure 8:
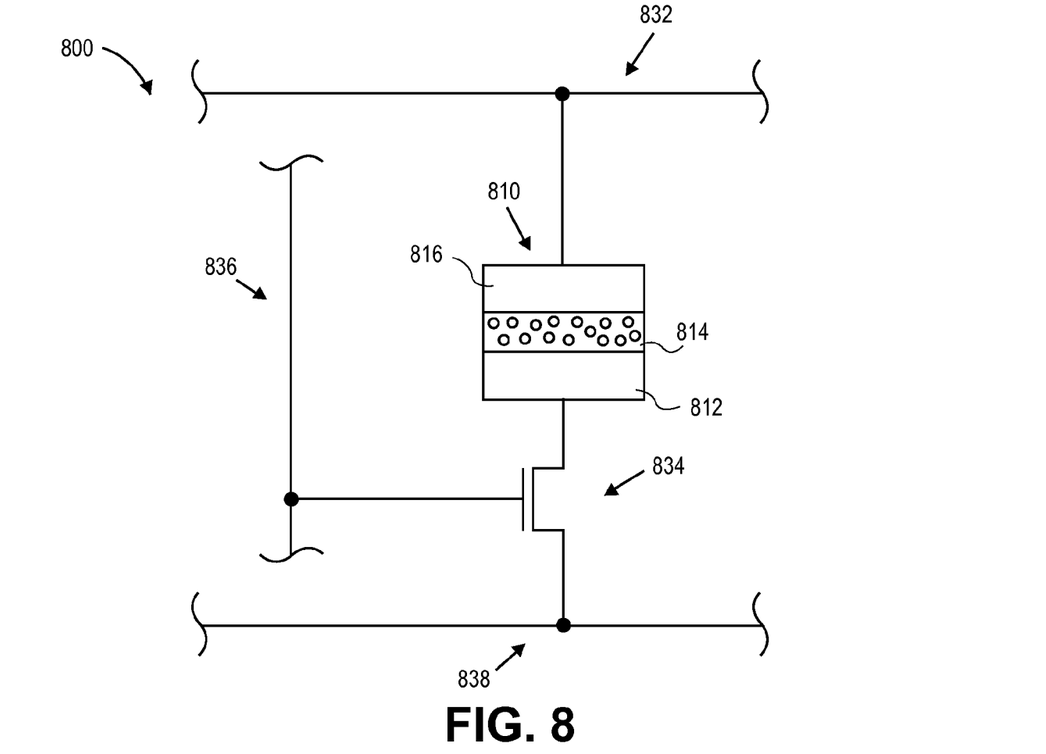
FIG. 8 illustrates a schematic of a memory bit cell which includes a metal-conductive oxide-metal (MCOM) memory element, in accordance with an embodiment of the present invention.

Referring to FIG. 8, the CORAM memory element 810 may include a first conductive electrode 812 with a conductive metal oxide layer 814 adjacent the first conductive electrode 812. A second conductive electrode 816 is adjacent the conductive metal oxide layer 814. The second conductive electrode 816 may be electrically connected to a bit line 832. The first conductive electrode 812 may be coupled with a transistor 834. The transistor 834 may be coupled with a word line 836 and a source line 838 in a manner that will be understood to those skilled in the art. The memory bit cell 800 may further include additional read and write circuitry (not shown), a sense amplifier (not shown), a bit line reference (not shown), and the like, as will be understood by those skilled in the art, for the operation of the memory bit cell 800. It is to be understood that a plurality of the memory bit cells 800 may be operably connected to one another to form a memory array (not shown), wherein the memory array can be incorporated into a non-volatile memory device. It is to be understood that the transistor 834 may be connected to the second conductive electrode 816 or the first conductive electrode 812, although only the latter is shown.

Figure 9:
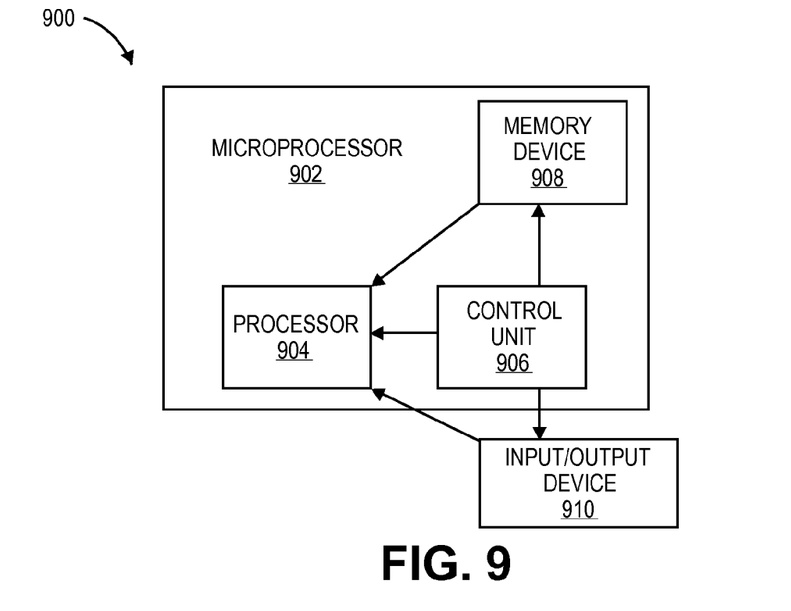
FIG. 9 illustrates a block diagram of an electronic system, in accordance with an embodiment of the present invention.

FIG. 9 illustrates a block diagram of an electronic system 900, in accordance with an embodiment of the present invention. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be understood that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. The memory device 908 can include a memory element having a conductive oxide and electrode stack as described in the present description. In an embodiment, the memory device 908 is embedded in the microprocessor 902, as depicted in FIG. 9.

Figure 10:
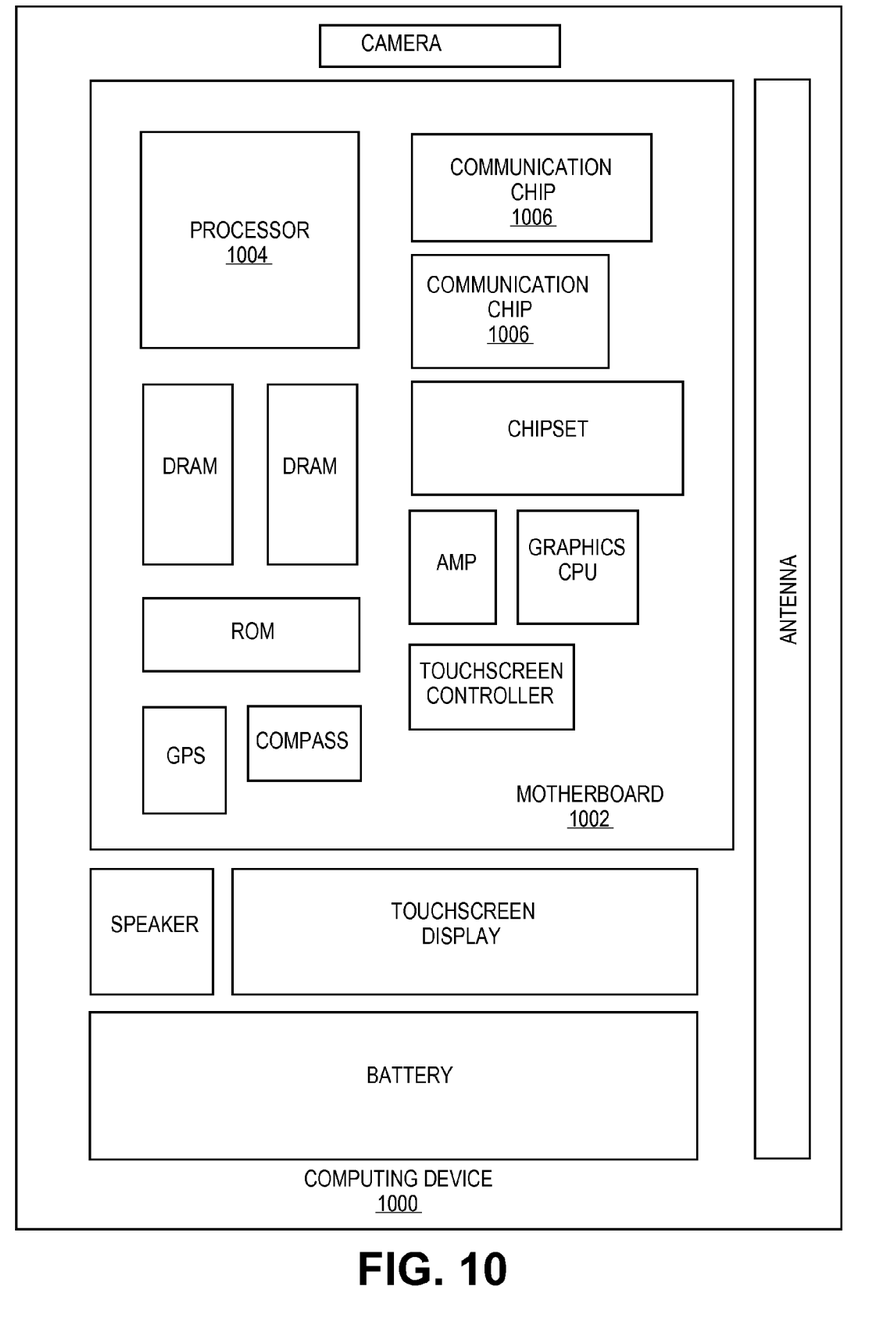
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes, or is electrically coupled with, one or more devices low voltage embedded memory having conductive oxide and electrode stacks in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes, or is electrically coupled with, one or more devices low voltage embedded memory having conductive oxide and electrode stacks in accordance with implementations of the invention.

In further implementations, another component housed within the computing device 1000 may contain an integrated circuit die that includes, or is electrically coupled with, one or more devices low voltage embedded memory having conductive oxide and electrode stacks in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, structures for and approaches to using low voltage embedded memory have been disclosed. The memory is based on conductive oxide and electrode stacks. Applications of such memory may include, but are not limited to, back end memory, embedded memory, resistive memory, RRAM. In one or more embodiments, the structural architecture of the memory is based on a junction-free arrangement, in that a non-conducting layer is not used in the functional element of the memory stack.

Accordingly, one or more embodiments of the present invention relate generally to the fabrication of microelectronic memory. The microelectronic memory may be non-volatile, wherein the memory can retain stored information even when not powered. One or more embodiments of the present invention relate to the fabrication of a memory element having a conductive oxide and electrode stack for non-volatile microelectronic memory devices. Such an element may be used in an embedded non-volatile memory, either for its non-volatility, or as a replacement for embedded dynamic random access memory (eDRAM). For example, such an element may be used for, or in place of, 1T-1X memory (X=capacitor or resistor) at competitive cell sizes within a given technology node.

Thus, embodiments of the present invention include conductive oxide random access memory (CORAM) cells and methods of fabricating CORAM cells.

In an embodiment, a material layer stack for a memory element includes a first conductive electrode. An insulating layer is disposed on the first conductive oxide and has an opening with sidewalls therein that exposes a portion of the first conductive electrode. A conductive oxide layer is disposed in the opening, on the first conductive electrode and along the sidewalls of the opening. A second electrode is disposed in the opening, on the conductive oxide layer.

In one embodiment, the sidewalls of the opening are each tapered at an angle that reduces the size of the opening from a top surface of the insulating layer to a top surface of the first conductive electrode.

In one embodiment, the angle is approximately 50 degrees.

In one embodiment, the insulating layer is a silicon nitride or silicon oxide layer.

In one embodiment, the conductive oxide layer has a thickness approximately in the range of 2-15 nanometers and is an oxygen deficient sub-stoichiometric oxide.

In one embodiment, the conductive oxide layer is an oxygen vacancy doped low resistance oxide layer having a thickness approximately in the range of 1-10 nanometers.

In one embodiment, the conductive oxide layer is amorphous.

In one embodiment, the resistivity of the conductive oxide layer is approximately in the range of 100 mOhm cm-10 kOhm cm when measured at a low field of approximately 0.1V.

In one embodiments, an initialization or forming operation is not required for conductivity of the conductive oxide layer.

In an embodiment, a non-volatile memory device includes a first conductive electrode. An insulating layer is disposed on the first conductive oxide and has an opening with sidewalls therein that exposes a portion of the first conductive electrode. A conductive oxide layer is disposed in the opening, on the first conductive electrode and along the sidewalls of the opening. A second conductive electrode is disposed in the opening, on the conductive oxide layer. A transistor is electrically connected to the first or the second electrode, a source line, and a word line. A bit line is electrically coupled with the other of the first or the second electrode.

In one embodiment, the first conductive electrode is disposed above the word line, and the bit line is disposed above the second conductive electrode.

In one embodiment, the first conductive electrode is disposed above the bit line, and the word line is disposed above the second conductive electrode.

In one embodiment, the sidewalls of the opening are each tapered at an angle that reduces the size of the opening from a top surface of the insulating layer to a top surface of the first conductive electrode.

In one embodiment, the angle is approximately 50 degrees.

In one embodiment, the insulating layer is a silicon nitride or silicon oxide layer.

In one embodiment, the conductive oxide layer has a thickness approximately in the range of 2-15 nanometers and is an oxygen deficient sub-stoichiometric oxide.

In one embodiment, the conductive oxide is amorphous.

In one embodiment, the resistivity of the conductive oxide layer is approximately in the range of 100 mOhm cm-10 kOhm cm when measured at a low field of approximately 0.1V.

In an embodiment, an integrated circuit includes a plurality of transistors disposed above a substrate having memory and logic regions. A plurality of alternating vias and conductive metal lines is disposed above and coupled with the plurality of transistors. A conductive oxide random access memory (CORAM) cell is disposed above a vertically second metal line, in the plurality of alternating vias and conductive metal lines.

In one embodiment, the CORAM cell is disposed on a partial via, and a conductive metal line is disposed on the CORAM cell. The partial via and conductive metal line included in the plurality of alternating vias and conductive metal lines.

In one embodiment, the CORAM cell is disposed on a conductive metal line, and a partial via is disposed on the CORAM cell. The partial via and conductive metal line included in the plurality of alternating vias and conductive metal lines.

In one embodiment, the CORAM cell occupies a full via depth, between conductive metal lines.

In one embodiment, the CORAM cell occupies a full conductive metal line height.

In one embodiment, the CORAM cell occupies a full conductive metal line height plus a full via depth.

In one embodiment, the CORAM cell is included in a lateral or vertical cross-point array.

What is claimed is:

1. A material layer stack for a memory element, the material layer stack comprising:
   a first conductive electrode having an uppermost surface;
   an insulating layer disposed on the uppermost surface of the first conductive electrode and having an opening with sidewalls therein, wherein the opening exposes only a portion of the first conductive electrode;
   a conductive oxide layer disposed in the opening, the conductive oxide layer having a first portion directly on and conformal with the exposed portion of the first conductive electrode, and having a second portion directly on and conformal with the sidewalls of the opening; and
   a second conductive electrode disposed in the opening and completely filling the remainder of the opening, wherein the second electrode is disposed directly on the conductive oxide layer, and wherein the second electrode has an uppermost surface co-planar with an uppermost surface of the insulating layer.

2. The material layer stack of claim 1, wherein the sidewalls of the opening are each tapered at an angle that reduces the size of the opening from the uppermost surface of the insulating layer to the uppermost surface of the first conductive electrode.

3. The material layer stack of claim 2, wherein the angle is approximately 50 degrees.

4. The material layer stack of claim 1, wherein the insulating layer is a silicon nitride or silicon oxide layer.

5. The material layer stack of claim 1, wherein the thickness is approximately in the range of 2-15 nanometers, and wherein the conductive oxide layer is an oxygen deficient sub-stoichiometric oxide.

6. The material layer stack of claim 1, wherein the conductive oxide layer is amorphous.

7. The material layer stack of claim 1, wherein the resistivity of the conductive oxide layer is approximately in the range of 100 mOhm cm-10 kOhm cm when measured at a low voltage of approximately 0.1V.

8. The material layer stack of claim 1, wherein a forming operation is not required for conductivity of the conductive oxide layer.

9. A non-volatile memory device, comprising:
   a first conductive electrode having an uppermost surface;
   an insulating layer disposed on the on the uppermost surface of the first conductive electrode and having an opening with sidewalls therein, wherein the opening exposes only a portion of the first conductive electrode;

a conductive oxide layer disposed in the opening, the conductive oxide layer having a first portion directly on and conformal with the exposed portion of the first conductive electrode, and having a second portion directly on and conformal with the sidewalls of the opening;

a second conductive electrode disposed in the opening and completely filling the remainder of the opening, wherein the second electrode is disposed directly on the conductive oxide layer, and wherein the second electrode has an uppermost surface co-planar with an uppermost surface of the insulating layer;

a transistor electrically connected to the first or the second electrode, a source line, and a word line; and a bit line electrically coupled with the other of the first or the second electrode.

10. The non-volatile memory device of claim 9, wherein the first conductive electrode is disposed above the word line, and wherein the bit line is disposed above the second conductive electrode.

11. The non-volatile memory device of claim 9, wherein the first conductive electrode is disposed above the bit line, and wherein the word line is disposed above the second conductive electrode.

12. The non-volatile memory device of claim 9, wherein the sidewalls of the opening are each tapered at an angle that reduces the size of the opening from the uppermost surface of the insulating layer to a top surface of the first conductive electrode.

13. The non-volatile memory device of claim 12, wherein the angle is approximately 50 degrees.

14. The non-volatile memory device of claim 9, wherein the insulating layer is a silicon nitride or silicon oxide layer.

15. The non-volatile memory device of claim 9, wherein the conductive oxide layer is amorphous.

16. The non-volatile memory device of claim 15, wherein the thickness approximately in the range of 2-15 nanometers and wherein the conductive oxide layer is an oxygen deficient sub-stoichiometric oxide.

17. The non-volatile memory device of claim 9, wherein the conductive oxide layer comprises a material selected from the group consisting of amorphous ITO ($In_2O_{3-x}SnO_{2-x}$), $In_2O_{3-x}$, amorphous solid solution of yttria and zirconia ($Y_2O_{3-x}ZrO_{2-x}$), and $La_{1-x}Sr_xGa_{1-y}Mg_yO_{3-X-0.5(x+y)}$.

18. The non-volatile memory device of claim 9, wherein the resistivity of the conductive oxide layer is approximately in the range of 100 mOhm cm-10 kOhm cm when measured at a low voltage of approximately 0.1V.

* * * * *